(12) United States Patent
Fekih-Romdhane

(10) Patent No.: US 7,872,931 B2
(45) Date of Patent: Jan. 18, 2011

(54) INTEGRATED CIRCUIT WITH CONTROL CIRCUIT FOR PERFORMING RETENTION TEST

(75) Inventor: Khaled Fekih-Romdhane, Burlington, VT (US)

(73) Assignee: Qimonda North America Corp., Cary, NC (US)

( * ) Notice: Subject to any disclaimer, the term of this patent is extended or adjusted under 35 U.S.C. 154(b) by 164 days.

(21) Appl. No.: 12/251,010

(22) Filed: Oct. 14, 2008

(65) Prior Publication Data

US 2010/0091595 A1 Apr. 15, 2010

(51) Int. Cl.
  *G11C 7/00* (2006.01)
  *G11C 8/00* (2006.01)
  *G11C 29/00* (2006.01)
(52) U.S. Cl. .................... 365/201; 365/233.1
(58) Field of Classification Search .............. 365/201, 365/233.1
See application file for complete search history.

(56) References Cited

U.S. PATENT DOCUMENTS

| 6,366,514 | B1* | 4/2002 | Chien ............... 365/222 |
| 6,496,947 | B1* | 12/2002 | Schwarz ............ 714/30 |
| 7,123,542 | B2 | 10/2006 | Fekih-Romdhane et al. |
| 7,164,613 | B2 | 1/2007 | Fekih-Romdhane et al. |
| 7,362,633 | B2 | 4/2008 | Fekih-Romdhane |
| 2005/0248755 | A1* | 11/2005 | Chou et al. ........... 356/222 |
| 2006/0198207 | A1* | 9/2006 | Ishikawa .......... 365/189.01 |
| 2006/0294443 | A1 | 12/2006 | Fekih-Romdhane |
| 2007/0226553 | A1 | 9/2007 | Fekih-Romdhane et al. |
| 2007/0234162 | A1* | 10/2007 | Barth ................ 714/736 |
| 2008/0159031 | A1 | 7/2008 | Fekih-Romdhane |

* cited by examiner

*Primary Examiner*—Ly D Pham
(74) *Attorney, Agent, or Firm*—Dicke, Billig & Czaja, PLLC

(57) ABSTRACT

An integrated circuit includes an array of memory cells, a clock generator configured to generate a clock signal, and a control circuit configured to perform a retention test on the array of memory cells based on the clock signal. A period of the clock signal defines a retention period for the retention test.

17 Claims, 4 Drawing Sheets

INTEGRATED CIRCUIT WITH CONTROL CIRCUIT FOR PERFORMING RETENTION TEST

BACKGROUND

Typically, an electronic system includes a number of integrated circuit chips that communicate with one another to perform system applications. Often, the electronic system includes a controller, such as a micro-processor, and one or more memory chips, such as random access memory (RAM) chips. The controller communicates with the memory to store data and to read the stored data.

The RAM chips can be any suitable type of RAM, such as dynamic RAM (DRAM) including single data rate synchronous DRAM (SDR-SDRAM), double data rate SDRAM (DDR-SDRAM), graphics DDR-SDRAM (GDDR-SDRAM), low power SDR-SDRAM (LPSDR-SDRAM), and low power DDR-SDRAM (LPDDR-SDRAM). Also, the RAM chips can be any suitable generation of memory including fourth generation DDR-SDRAM (DDR4-SDRAM), fifth generation GDDR-SDRAM (GDDR5-SDRAM), and higher generations of memory. Usually, each new generation of memory operates at an increased clock speed and/or an increased data rate from the previous generation.

During the manufacturing process, multiple memory devices are typically fabricated on a single silicon wafer and undergo some form of testing (commonly referred to as wafer or "front-end" test) before the devices are separated and packaged individually. Such testing typically entails writing test data patterns to a particular series of address locations, reading data back from the same address locations, and comparing the data patterns read back to the data patterns written, in order to verify device operation. If the data read from a memory cell does not match the previously written data, the memory cell fails. Such failing memory cells may be identified during the test and replaced with redundant memory cells.

SUMMARY

One embodiment provides an integrated circuit that includes an array of memory cells, a clock generator configured to generate a clock signal, and a control circuit configured to perform a retention test on the array of memory cells based on the clock signal. A period of the clock signal defines a retention period for the retention test.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
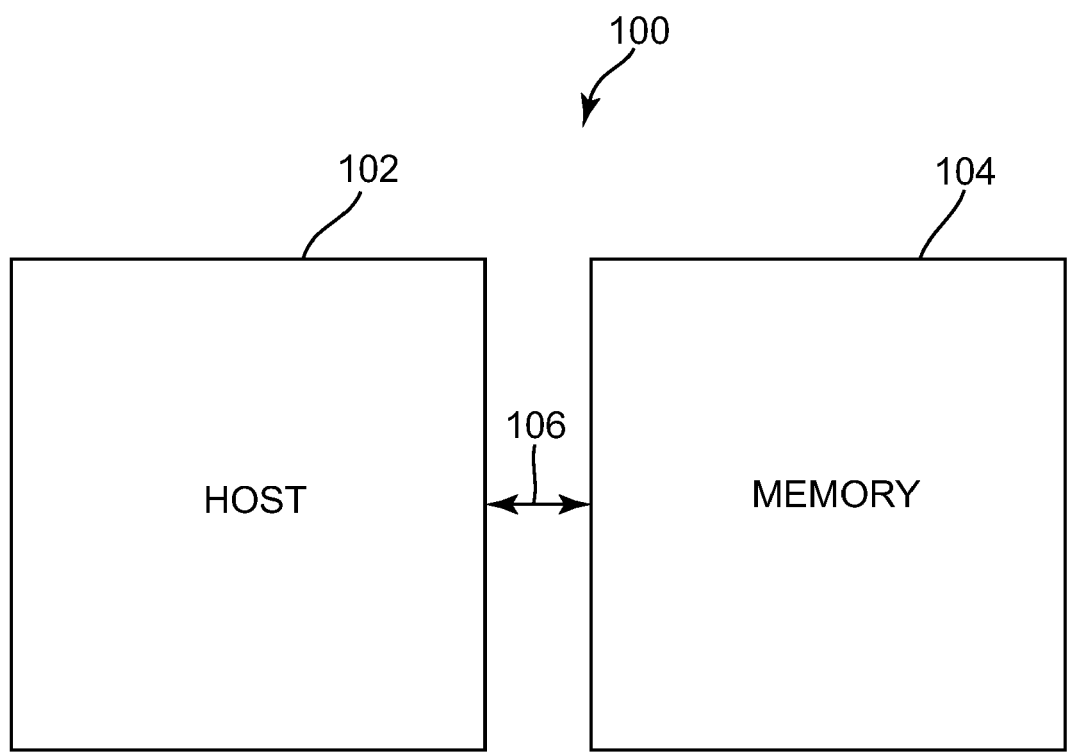
FIG. 1 is a block diagram illustrating a system with a memory device according to one embodiment.

FIG. 1 is a block diagram illustrating a system 100 according to one embodiment. System 100 includes a host 102 and a memory device 104. Host 102 is communicatively coupled to memory device 104 through communication link 106. Host 102 includes a computer (e.g., desktop, laptop, handheld), portable electronic device (e.g., cellular phone, personal digital assistant (PDA), MP3 player, video player, digital camera), or any other suitable device that uses memory. Memory 104 device provides data storage for host 102. In one embodiment, memory device 104 is an integrated circuit or part of an integrated circuit. In one embodiment, memory device 104 is a dynamic random access memory (DRAM) device.

Figure 2:
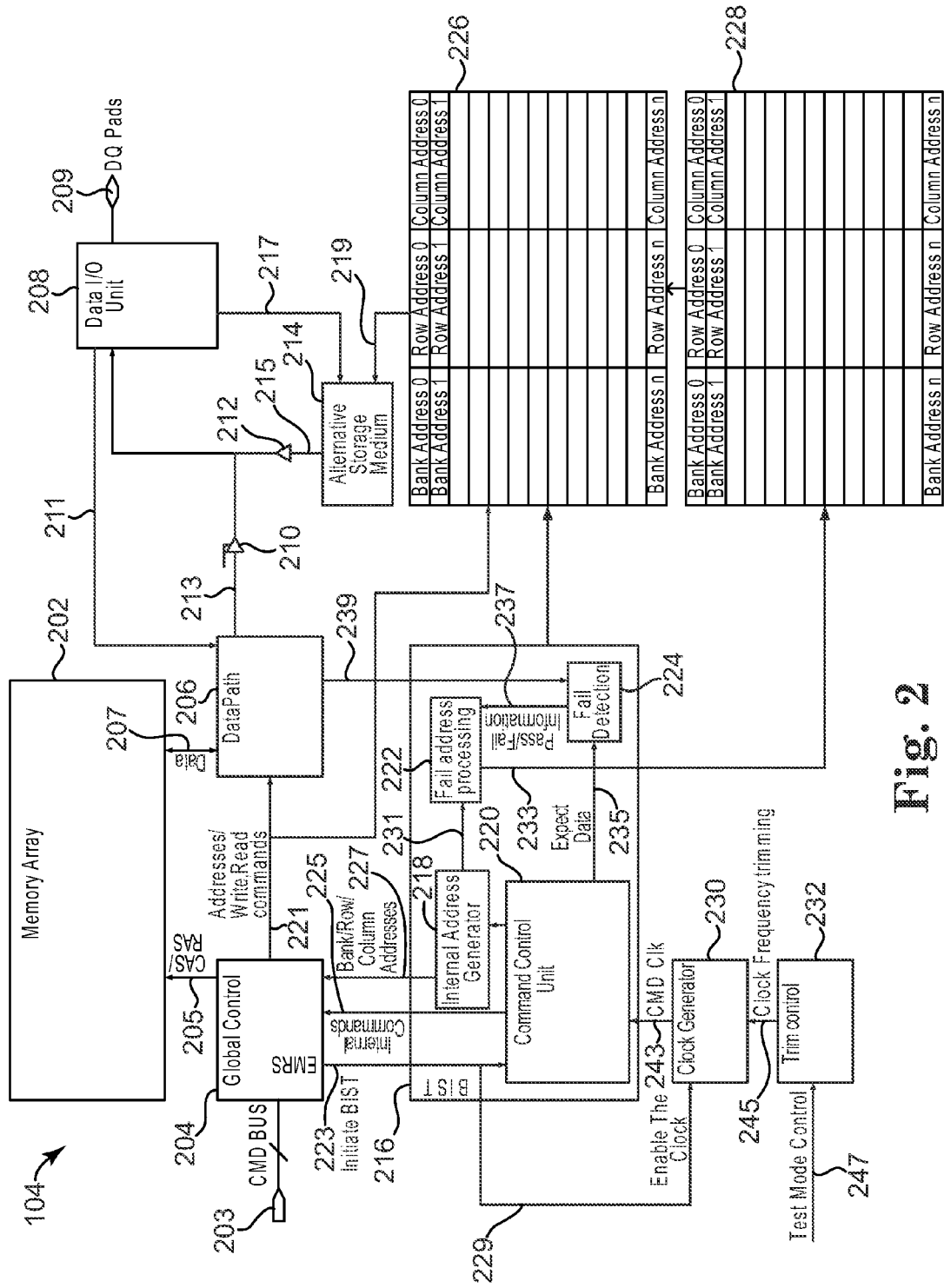
FIG. 2 is a block diagram illustrating a memory device according to one embodiment.

FIG. 2 is a diagram illustrating a memory device 104 according to one embodiment. In one embodiment, memory device 104 is configured to produce an efficient retention test pattern without relying on external automated test equipment (ATE) to externally provide commands in a desired sequence. Memory device 104 includes memory array 202, global controller 204, data path 206, data input/output (I/O) unit 208, amplifiers 210 and 212, alternative storage medium (ASM) 214, built-in self-test (BIST) circuit 216, address storage units 226 and 228, clock generator 230, and clock trim controller 232. BIST circuit 216 includes internal address generator 218, command control unit 220, fail address processing unit 222, and fail detection unit 224. In one embodiment, the communication link 106 (FIG. 1) between host 102 and memory device 104 includes a command (CMD) bus 203 and data (DQ) pads 209. In one embodiment, memory array 202 includes a plurality of memory cells, a plurality of word lines (rows), and a plurality of bit lines (columns), with each memory cell electrically coupled to a word line and a bit line.

In one embodiment, memory device 104 is configured to operate in a normal mode of operation or a test mode of operation. The normal mode of operation according to one embodiment will be described first, followed by a description of one embodiment of the test mode. During the normal mode according to one embodiment, memory device 104 is configured to communicate with host 102 (FIG. 1) and to read data from and write data to memory array 202. Global controller 204 receives read commands, write commands, and other commands from an external source (e.g., host 102) via command bus 203. Global controller 204 provides column address strobe (CAS) and row address strobe (RAS) signals to memory array 202 via communication link 205.

Global controller 204 outputs read and write commands and addresses to data path 206 and address storage unit 226 via communication link 221. When a read command is received via command bus 203, global controller 204 provides the address information for the read command to data path 206 and address storage unit 226. Address storage unit 226 determines whether the address for the read command is a fail address, and provides a corresponding indication to alternative storage medium 214 via communication link 219.

If the address for the read command is a fail address, amplifier 212 is enabled and the data for the read command is output from the alternative storage medium 214 to the data I/O unit 208 via communication link 215, and data I/O unit 208 outputs the data through DQ pads 209. If the address for the read command is not a fail address, the data for the read command is output from memory array 202 to data path 206 via communication link 207. Amplifier 210 is enabled, and the data is transferred from data path 206 to data I/O unit 208 via communication link 213. Data I/O unit 208 outputs the data on DQ pads 209.

When a write command is received via command bus 203, global controller 204 provides the address information for the write command to data path 206 and address storage unit 226 via communication link 221. Address storage unit 226 determines whether the address for the write command is a fail address, and provides a corresponding indication to alternative storage medium 214 via communication link 219. If the address for the write command is a fail address, the data for the write command, received on DQ pads 209, is transferred from data I/O unit 208 to alternative storage medium 214 via communication link 217. If the address for the write command is not a fail address, the data for the write command, received on DQ pads 209, is transferred from data I/O unit 208 to data path 206 via communication link 211. Data path 206 then outputs the data for the write command to memory array 202 via communication link 207.

Memory device 104 is configured to enter a test mode in one embodiment when an extended mode register set (EMRS) "initiate test" command is received via command bus 203. When an "initiate test" command is received, global controller 204 responds by outputting an initiate BIST signal to command control unit 220 via communication link 223, which causes command control unit 220 to begin a self-test and initiate a self-test command sequence. The initiate BIST signal is also provided to clock generator 230 via communication link 229, which causes clock generator 230 to be enabled and begin providing a command clock signal to command control unit 220 via communication link 243. In one embodiment, clock generator 230 is a variable clock generator configured to generate a variable clock signal with a variable clock period, with the clock period (frequency) being modifiable by trim controller 232. In one embodiment, BIST circuit 216 is configured to perform a retention test on the array 202 of memory cells based on the clock signal, wherein a period of the clock signal defines a retention period for the retention test. In one embodiment, the clock period is modifiable to test memory device 104 for one or more different retention periods.

During the test mode, command control unit 220 outputs a sequence of commands to global controller 204 via communication link 225, and internal address generator 218 outputs addresses for the commands to global controller 204 via communication link 227. These internally generated commands are then processed by device 104 in the same manner that externally provided commands through command bus 203 are processed. In the test mode, the memory device 104 operates at the internally generated clock frequency produced by clock generator 230.

During the test mode, data is output from memory array 202 to fail detection unit 224 through data path 206 and communication links 207 and 239. Fail detection unit 224 compares the received data to expected data received from command control unit 220 through communication link 235 to determine if the data received from memory array 202 is correct or not. Based on the comparison, fail detection unit 224 outputs pass/fail information to fail address processing unit 222 through communication link 237. Fail address processing unit 222 also receives address information from internal address generator 218 through communication link 231. Fail address processing unit 222 identifies addresses at which failures have occurred, and outputs these fail addresses to address storage unit 228 via communication link 233. In one embodiment, address storage unit 228 provides for the temporary storage of fail addresses, and at the end of testing, the fail addresses are hard coded into address storage unit 226.

Clock trim controller 232 is configured to receive a test mode control signal via communication link 247. Based on the received test mode control signal, clock trim controller 232 generates a trim signal that is output to clock generator 230 through communication link 245. The trim signal causes the period (frequency) of the clock signal output by clock generator 230 on communication link 243 to be trimmed or adjusted. In one embodiment, as described in further detail below, the test mode control signal indicates a desired or target value for the retention period of a retention test, and the trim signal is configured to modify the clock signal to have a period that will produce the target retention time.

In one embodiment, memory device 104 is configured to perform a built-in self-test during the test mode, with the self-test including a data retention test that tests for failures of data retention in array 202. During the retention test according to one embodiment, command control unit 220 generates a retention test command sequence that includes commands for writing known data patterns to the cells in array 202 in a predetermined order, and reading data back from the cells in the array 202 in the same predetermined order. In one embodiment, the particular order in which cells in the array 202 are accessed is determined by a particular test mode selected. The data read from the array 202 is compared by fail detection unit 224 to the data written to the array 202 to check for errors. In one embodiment, the retention test command sequence includes at least one write command that writes data to memory array 202, followed by at least one read command that reads the data from memory array 202 that was written during the at least one write command. The time that expires between the writing of data to a given cell in memory array 202 during the retention test and the reading of data from that cell is the retention period for the test. Fail address processing unit 222 identifies cells in array 202 that fail the retention test and that do not properly retain the written data for the retention period.

In one embodiment, the retention test command sequence includes a full array write sequence in which data is written to all cells in array 202, followed by a full array read sequence in which the data that was written during the full array write sequence is read from all of the cells in array 202. In one form of this embodiment, the full array write sequence is performed in a "Fast-X" pattern. With this pattern according to one embodiment, the first row (word line) in array 202 is activated, and all bits (columns) on that row are overwritten by writing on all of the column select lines (CSL) available in the array 202. After all of the column select lines are accessed, the first row is then deactivated (precharged) to allow for the activation of the adjacent row. This process is then repeated for the adjacent row, and all subsequent rows in the array 202, until all of the cells in the array 202 have been overwritten with a predefined test data pattern.

After all of the cells in the array 202 have been overwritten, the cells are then read in the same order in which they were written. In one embodiment, the command control unit 220 is configured to control the test data pattern based on row and column addresses, and includes a row and column counter, row address overflow detector, and column address overflow detector to assist in the process. After the write sequence and the read sequence for the retention test are complete, command control unit 220 sends a clock disable signal to clock generator 230 via communication link 243 to disable the generation of the clock signal, and thereby reduce the power consumption of device 104.

Figure 3:
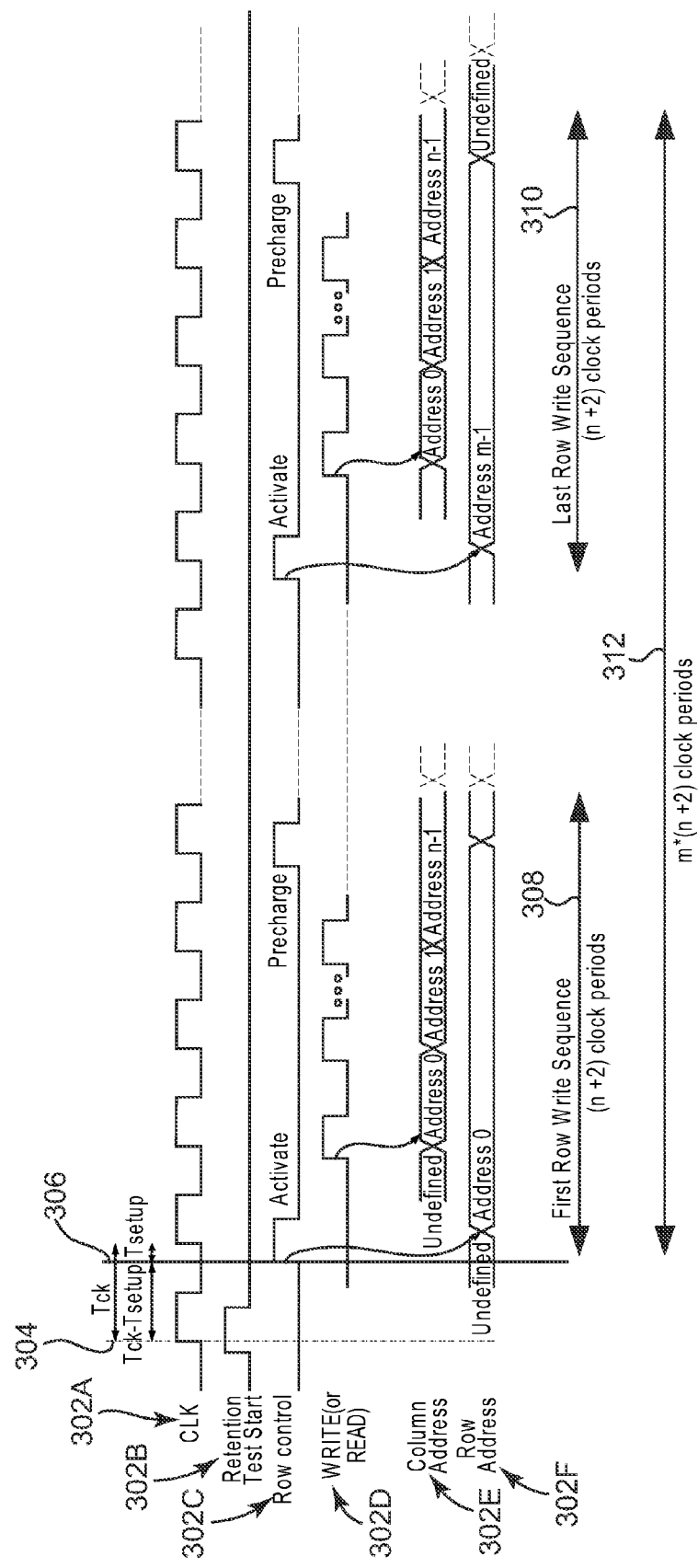
FIG. 3 is a timing diagram illustrating the timing of control signals for a retention test according to one embodiment.

FIG. 3 is a timing diagram illustrating the timing of control signals for a retention test according to one embodiment. The signals shown in FIG. 3 include a clock (CLK) signal 302A, a retention test start signal 302B, a row control signal 302C, a write signal 302D, a column address signal 302E, and a row address signal 302F. Clock signal 302A represents the clock signal generated by clock generator 230. As shown in FIG. 3, the clock signal 302A has a period, Tck. The time between the rising edge of the first "activate" row control signal 302C (indicated by line 306) and the rising edge of the second clock pulse in clock signal 302A is represented by setup time, Tsetup. The time between the rising edge of the first clock pulse in clock signal 302A (indicated by line 304) and the rising edge of the first "activate" row control signal 302C (indicated by line 306) is equal to the clock period, Tck, minus the setup time, Tsetup.

The retention test begins by pulsing the retention test start signal 302B. In one embodiment, the retention test start signal 302B corresponds to the "initiate BIST" signal discussed above. An activate signal is then generated by pulsing the row control signal 302C, and the address (address 0) of the first row is provided with the row address signal 302F. The write signal 302D is then pulsed high for each column in the first row, and a column address for each column is provided with the column address signal 302E. Data (not shown in FIG. 3) is written to each selected column in the first row. Thus, after the first row write sequence 308, all bits in the first row of array 202 are overwritten. After all of the columns in the first row are accessed and overwritten, the first row is then deactivated (precharged) by pulsing the row control signal 302C, thereby allowing for the activation of the adjacent row (i.e., the second row). The write sequence 308 is then repeated for the adjacent row, and all subsequent rows in the array 202, until all of the cells in the array 202 have been overwritten with a predefined test data pattern. Although only the write sequence 308 for the first row and the write sequence 310 for the last row are shown in FIG. 3, it will be understood that the write sequences for all of the rows in between will be the same as those for the first and last rows.

After all of the cells in the array 202 have been overwritten, the cells are then read in the same order in which they were written. The read sequence for the retention test is the same as the write sequence, with the exception that signal 302D is a read signal rather than a write signal. In one embodiment, during the read sequence, the command control unit 220 feeds expected data to the fail detection unit 224 via communication link 235. In one embodiment, the expected data is the same as the data written to array 202 during the write sequence.

The write sequence for each row has a total time duration given by the following Equation I:

$$T_1 = (n+2) * Tck \qquad \text{Equation I}$$

Where:
  $T_1$=time duration for the write sequence for one row in array 202;
  n=number of columns in each row in array 202; and
  Tck=period of the clock signal 302A generated by clock generator 230.

Assuming a total number, m, of word lines (rows) in array 202, the total duration of the complete write sequence, indicated at 312 in FIG. 3, is given by the following Equation II:

$$T_{Total} = m * (n+2) * Tck \qquad \text{Equation II}$$

Where:
  $T_{Total}$=time duration for the write sequence for all rows in array 202;
  m=number of rows in array 202;
  n=number of columns in each row in array 202; and
  Tck=period of the clock signal 302A generated by clock generator 230.

To achieve an equal time between the write access and the read access for all cells in array 202 during the retention test, the row and column accesses during the read sequence are the same as during the write sequence. The time between the write access and the read access for any given cell in array 202 according to one embodiment is given by the following Equation III:

$$T_{W/R} = [m*(n+2) - (n+2)] * Tck = (m-1) * (n+2) * Tck \qquad \text{Equation III}$$

Where:
  $T_{W/R}$=time between the write access and the read access for each individual cell in array 202 during the retention test;
  m=number of rows in array 202;
  n=number of columns in each row in array 202; and
  Tck=period of the clock signal 302A generated by clock generator 230.

To test the retention capability of the array 202, the time duration given in Equation III is matched to a retention period target value, as shown in the following Equation IV:

$$T_{rt} = (m-1) * (n+2) * Tck \qquad \text{Equation IV}$$

Where:
  $T_{rt}$=retention period target value;
  m=number of rows in array 202;
  n=number of columns in each row in array 202; and
  Tck=period of the clock signal 302A generated by clock generator 230.

Using Equation IV, the clock period of the clock signal 302A generated by clock generator 230 can be calculated as a function of the retention period target value, $T_{rt}$, as shown in the following Equation V:

$$Tck = T_{rt} / (m-1) * (n+2) \qquad \text{Equation V}$$

Where:
  T=retention period target value;
  m=number of rows in array 202;
  n=number of columns in each row in array 202; and
  Tck=period of the clock signal 302A generated by clock generator 230.

In one embodiment, Equation V is used to determine a clock period, Tck, for clock generator 230, which will produce a desired or target retention period, $T_{rt}$, during the retention test. For example, if the target retention period, $T_{rt}$, is 200 milliseconds (ms), and assuming that array 202 includes 2K columns (i.e., n=2048) and 8K rows (i.e., m=8192), the clock period, Tck, for clock generator 230 is adjusted in one embodiment to 11.91 nanoseconds (ns) in order to produce the target retention period during the retention test.

In one embodiment, the target retention period is entered into trim controller 232 by a user, such as a test engineer, via a test mode control communication link 247. Trim controller 232 according to one embodiment is configured to generate an appropriate trim signal based on the received target retention period to trim the clock signal generated by clock generator 230 and produce the desired target retention period. In another embodiment, trim controller 232 includes a hard coded medium, such as a laser fuse, that stores trim information for causing clock generator 230 to produce a desired retention period. After the target retention period has been defined, memory device 104 performs a retention test, including a write sequence followed by a read sequence, with the time difference between the write and the read on all cells in array 202 being the same and equal to the retention period.

Figure 4:
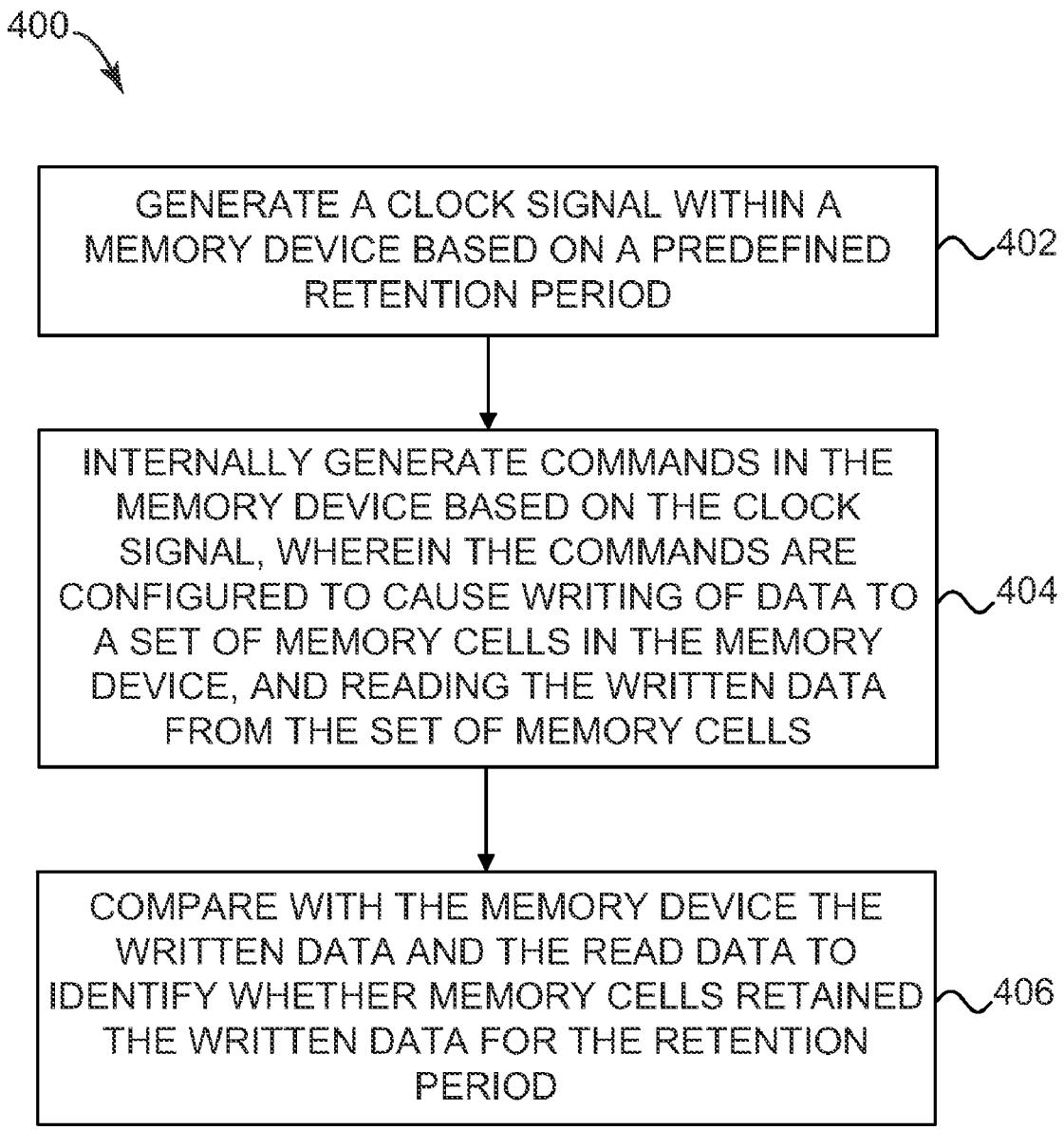
FIG. 4 is a flow diagram illustrating a method of testing a memory device that includes an array of memory cells according to one embodiment.

FIG. 4 is a flow diagram illustrating a method 400 of testing a memory device 104 that includes an array 202 of memory cells according to one embodiment. At 402, a clock signal 302A is generated within the memory device 104 based on a retention period. In one embodiment, the retention period is defined by a user, and the period of the clock signal 302A is trimmed within the memory device 104 based on the user defined retention period. In one embodiment, generation of the clock signal 302A is automatically enabled at the beginning of the testing of the memory device 104, and is automatically disabled at the end of the testing of the memory device 104.

At 404, commands are internally generated in the memory device 104 based on the clock signal 302A, wherein the commands are configured to cause writing of data to a set of the memory cells, and reading the written data from the set of memory cells. In one embodiment, the set of memory cells includes all cells in the array 202 of memory cells.

At 406, the memory device 104 compares the written data and the read data to identify whether memory cells retained the written data for the retention period. In one embodiment, the retention period represents the time duration between the writing of data to a memory cell and the reading of data from the memory cell. The retention period according to one embodiment is the same for all memory cells in the set of memory cells.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
an array of memory cells;
a clock generator configured to generate a clock signal;
a control circuit configured to perform a retention test on the array of memory cells based on the clock signal, wherein a period of the clock signal defines a retention period for the retention test; and
a trim controller configured to trim the clock generator based on a user-defined value for the retention period and thereby modify the period of the clock signal.

2. The integrated circuit of claim 1, wherein the retention test includes generating commands with the control circuit for writing data to a set of the memory cells, reading the written data from the set of memory cells, and comparing the written data with the read data to identify whether memory cells failed the retention test.

3. The integrated circuit of claim 2, wherein the retention period represents the time duration between the writing of data to a memory cell and the reading of data from the memory cell.

4. The integrated circuit of claim 3, wherein the retention period is the same for all memory cells in the set of memory cells.

5. The integrated circuit of claim 2, wherein the set of memory cells includes all cells in the array of memory cells.

6. The integrated circuit of claim 1, wherein the clock generator is configured to be automatically enabled at a beginning of the retention test.

7. The integrated circuit of claim 6, wherein the clock generator is configured to be automatically disabled at an end of the retention test.

8. The integrated circuit of claim 1, wherein the integrated circuit is a DRAM device.

9. The integrated circuit of claim 1, wherein the control circuit is part of a built-in self-test (BIST) circuit.

10. A method of testing a memory device that includes an array of memory cells, comprising:
generating a clock signal within the memory device based on a predefined retention period;
internally generating commands in the memory device based on the clock signal, wherein the commands are configured to cause writing of data to a set of the memory cells, and reading the written data from the set of memory cells;
comparing with the memory device the written data and the read data to identify whether memory cells retained the written data for the retention period; and
automatically disabling generation of the clock signal at an end of the testing of the memory device.

11. The method of claim 10, wherein the retention period represents the time duration between the writing of data to a memory cell and the reading of data from the memory cell.

12. The method of claim 11, wherein the retention period is the same for all memory cells in the set of memory cells.

13. The method of claim 10, wherein the set of memory cells includes all cells in the array of memory cells.

14. The method of claim 10, wherein the retention period is defined by a user, and wherein the method further comprises:
trimming the clock signal within the memory device based on the user defined retention period.

15. The method of claim 10, and further comprising:
automatically enabling generation of the clock signal at a beginning of the testing of the memory device.

16. A memory device, comprising:
an array of memory cells;
a variable clock generator configured to generate a variable clock signal;
a self-test circuit configured to perform a retention test on the array of memory cells based on the variable clock signal; and
a trim controller configured to modify a period of the clock signal based on a user-defined value for the retention period.

17. The memory device of claim 16, wherein the retention test includes generating internal commands with the self-test circuit for writing data to a set of the memory cells, reading the written data from the set of memory cells, and comparing the written data with the read data to identify whether memory cells failed the retention test.

* * * * *